(12) United States Patent
Bayer et al.

(10) Patent No.: US 6,356,089 B2
(45) Date of Patent: *Mar. 12, 2002

(54) CONTACT PROBE ARRANGEMENT

(75) Inventors: Thomas Bayer, Aidlingen-Dachtel; Johann Greschner, Pliezhausen; Klaus Meissner, Herrenberg-Kayh; Werner Steiner, Böblingen; Roland Stoehr, Nufringen, all of (DE)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/946,964

(22) Filed: Oct. 8, 1997

(51) Int. Cl.[7] ............................................... G01R 31/02
(52) U.S. Cl. ........................................ 324/754; 324/761
(58) Field of Search ................................ 324/758, 754, 324/756, 72.5, 761; 439/66, 591

(56) References Cited

U.S. PATENT DOCUMENTS

| 4,622,514 | A | * | 11/1986 | Lewis | 324/761 |
| 4,843,315 | A | * | 6/1989 | Bayer et al. | 324/756 |
| 5,367,254 | A | * | 11/1994 | Faure et al. | 324/761 |
| 5,385,477 | A | * | 1/1995 | Vaynkof et al. | 439/66 |
| 5,488,314 | A | * | 1/1996 | Brandt et al. | 324/758 |
| 5,517,126 | A | * | 5/1996 | Yamaguchi | 324/758 |

* cited by examiner

*Primary Examiner*—Ernest Karlsen
*Assistant Examiner*—Minh N. Tang
(74) *Attorney, Agent, or Firm*—Robert M. Trepp

(57) ABSTRACT

The invention relates to a contact probe arrangement for electrically connecting a test system with contact pads of a device to be tested. The contact probes are located in guide grooves. The guide grooves as well as areas are provided in a plane parallel to the surface of a guide plate and are covered by a protective plate. The contact probes may bend out laterally into the respective areas. This assures a very dense contact probe array. Contact probe arrays of this type may be used, for example, for detecting opens and shorts in integrated circuits or semiconductor chips. The invention overcomes the problem of adjusting for height differences in the contact pads caused by an uneven surface of the device to be tested.

13 Claims, 5 Drawing Sheets

CONTACT PROBE ARRANGEMENT

FIELD OF THE INVENTION

This invention relates to a contact probe arrangement for electrically connecting a test system with the circular contact pads of a device to be tested. In order to achieve a low contact resistance the contact probes are orthogonally pressed onto the contact pads, and for adjusting height differences in the contact pads caused by an uneven surface of the device to be tested they may bend out laterally.

Contact probes of this type may be used, for example, for detecting opens and shorts in electrical circuit arrays of microelectronic compounds.

BACKGROUND OF THE INVENTION

The electrical testing of microelectronic compounds such as printed circuit cards, ceramic modules or semiconductor chips is currently performed mainly with needle cards. In addition to their low durability and frequent need for re-adjustment, the main limitation in the use of needle cards is the minimal distance between two adjacent needles: the distance is around 100 μm in the most favourable case.

An alternative is provided by testing and power supply devices with bending wires. Their principal characteristic is the individual, meandering guiding of each wire in a stack of guide plates. The guide grooves traverse each guide plate orthogonal to its surface. The particular advantage of this technique arises from the possibility of being able to produce relatively dense two-dimensional arrangements of contact wires. In this bending wire technique through-holes must be drilled through the guide plates with a diameter at least as large as the diameter of the contact probe. The distance between the holes is limited by the drilling technique itself, because the wall thicknesses between the holes cannot fall below certain minimums.

A contact probe arrangement of this kind is known from European Patent document EP-A-0 283 545 by T. Bayer et al. and assigned to the assignee herein. This document describes how, despite a reduced diameter of the contact probes, the necessary low contact resistance can be maintained by appropriate arrangement and design in the stack of perforated plates.

U.S. Pat. No. 5,385,477 describes a bending wire contacting device in which the bending wires are encapsulated in a housing filled with dielectric elastic materials, and are thus elastically coupled together. This permits a more dense arrangement of the wires while still ensuring that the individual wires are insulated from each other.

The advantage of the bending wire arrangements described is the possibility of being able to produce relatively dense two-dimensional or flat contact probe arrangements. Numerous test applications in microelectronics specify only dense one-dimensional or linear contact probe arrangements.

The object of the invention is to provide an easy-to-produce, low-cost contact probe arrangement with a very dense linear and flat arrangement.

SUMMARY OF THE INVENTION

In the contact probe arrangement in accordance with the invention, the contact probes pressed orthogonally onto the contact pads are located in guide grooves which run parallel to the surface of the guide plate and are covered by a protective plate. The contact probes bend laterally into the areas provided, which likewise run parallel to the surface of the guide plate and are covered by the protective plate.

The guide plates in a plane of a guide plate and the areas for lateral bending can be arranged much more densely next to each other in one plane than is possible in the various stacked planes. The walls between the individual guide grooves and the areas for lateral bending can be much thinner than when through-holes with the diameter of the guide grooves have to be drilled through several guide plates.

As well as a generally more dense arrangement of the contact wires, a very dense one-dimensional arrangement of the contact probes can in particular be achieved in a low-cost way by this means.

An advantageous feature is that the guide grooves and the areas for lateral bending are produced by means of etching techniques. This permits very precise production of the structures, but also with these methods their geometry can be chosen such that lower friction occurs in the guide grooves and the areas for lateral bending. This substantially improves the durability of the contact probe arrangement.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENT

Figure 1:
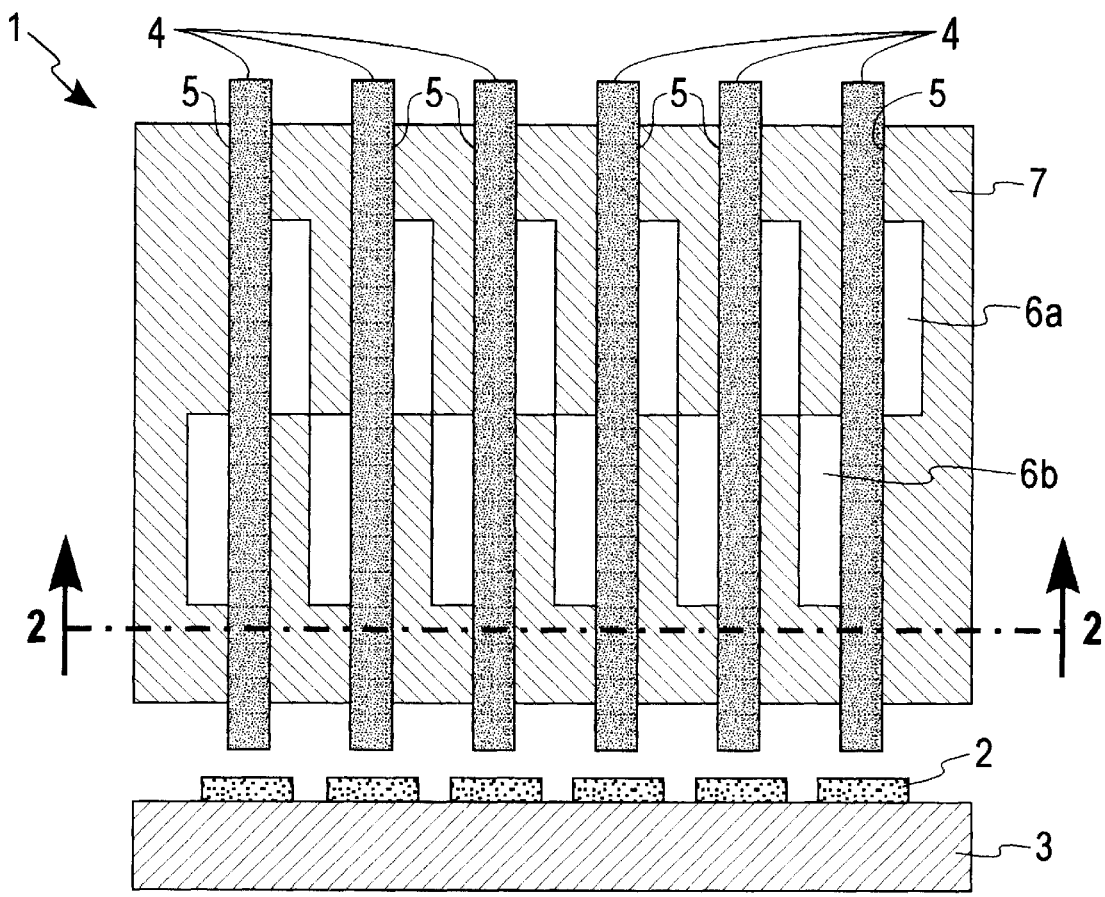
FIG. 1 shows a cross-section through a device to be tested and through a guide plate of a contact probe arrangement in which the probes are located opposite the contact pads of the device to be tested.

The cross-section through the guide plate 7 of a contact probe arrangement 1 in FIG. 1 shows a dense linear arrangement of guide grooves 5 filled with contact probes 4 and of areas 6a, 6b for lateral bending of the contact probes 4. The contact probes 4 are located opposite the contact pads 2 of a device to be tested 3. As in the case of the bending wire contacting devices known from the state of the art, the contact probes 4 can bend out individually into the areas 6a, 6b provided for them.

Figure 3:
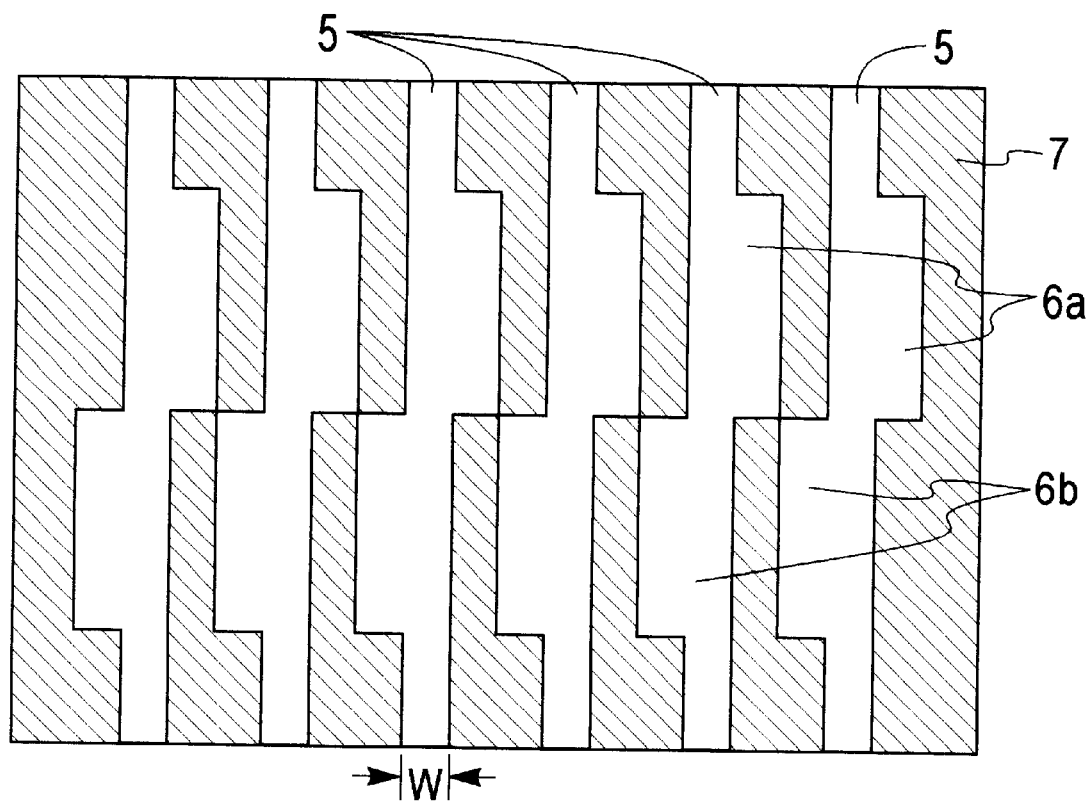
FIG. 3 shows the top view onto a guide plate with several adjacent guide grooves and areas for lateral bending of the contact probes.

The guide grooves 5 and the areas 6a, 6b for lateral bending of the contact probes 4 run in a plane parallel to surface of a guide plate 7. FIG. 3 shows the top view onto a guide plate 7 with several adjacent guide grooves 5 and areas 6a, 6b for lateral bending of the contact probes. The areas 6a, 6b for lateral bending of the contact probes 4 are arranged along the guide grooves 5, alternating from side to side and flush with each other.

Figure 2:
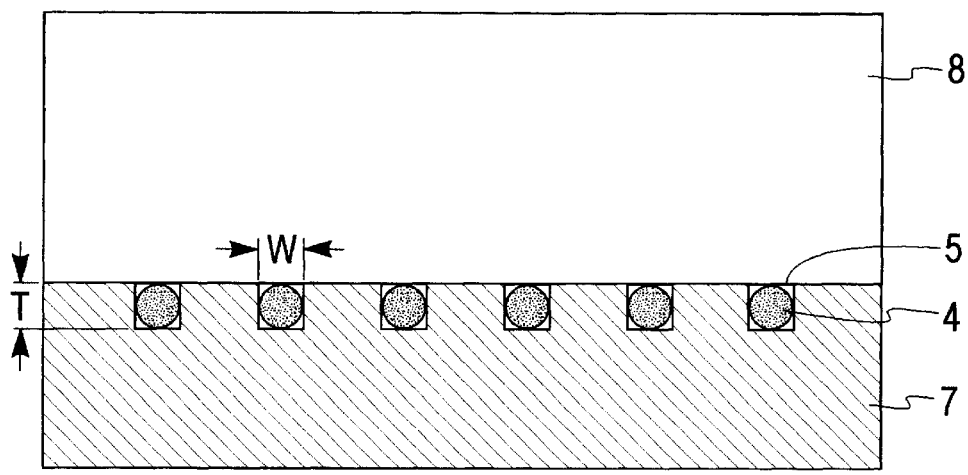
FIG. 2 shows a cross-section through the contact probe arrangement along the line 2—2 in FIG. 1 with contact probes in the guide grooves.

As can be seen from the cross-section along the line 2—2 of FIG. 1 shown in FIG. 2, the guide plate is covered by a protective plate 8. A linear or one-dimensional contact probe arrangement can thus be realized by means of two plates. Both said plates may be in the form of guide plates or, as in the embodiment shown in FIG. 2, as a guide plate and an unstructured protective plate. The depth T and the width W of the guide grooves 5 and of the areas 6a, 6b for lateral bending of the contact probes 4 correspond at least to the diameter of a contact probe.

The materials for the guide plate 7 and for the protective plate 8 should be chosen such that they essentially have the same coefficients of thermal expansion. Silicon is especially suitable as the material for the guide plate, and the protective plate material could preferentially be Pyrex glass, because both materials have the same coefficient of thermal expansion. These materials can also be easily joined together by means of adhesion or, without adhesive, by means of anodic bonding.

The lateral arrangement of the guide grooves and of the areas for lateral bending in the same plane of a guide plate is especially advantageous because, as a result, a stack of several guide plates is no longer required to form the areas for lateral bending.

A further advantage of the contact probe arrangement in accordance with the invention is the possibility of manufacturing them using the etching techniques familiar from semiconductor technology, such as plasma etching, based on the lateral arrangement of the guide grooves 5 and the areas 6a, 6b for lateral bending of the contact probes 4 in only one plane. Etching techniques such as plasma etching or reactive ionic etching are particularly suitable. As a result, it is no longer necessary to drill through the guide plates, as is the case in the conventional bending wire devices. The etching techniques cited also permit much more precise dimension checking. This is the key to creating a much more dense arrangement of the guide grooves.

The etching depth is much less than the plate thickness which needs to be drilled through; it corresponds to the diameter of a contact probe. As a result, the etching technique is not only precise but also more cost-effective.

The areas to be etched are defined by photolithographic methods, as is familiar from semiconductor technology. These methods allow differing geometries to be used for the guide grooves and the areas for lateral bending. The selection of particularly suitable geometries and the edge shaping made possible by etching, e.g. guide grooves or bend areas with rounded walls, can reduce friction and thus substantially improve the durability of the contact wires.

Figure 4:
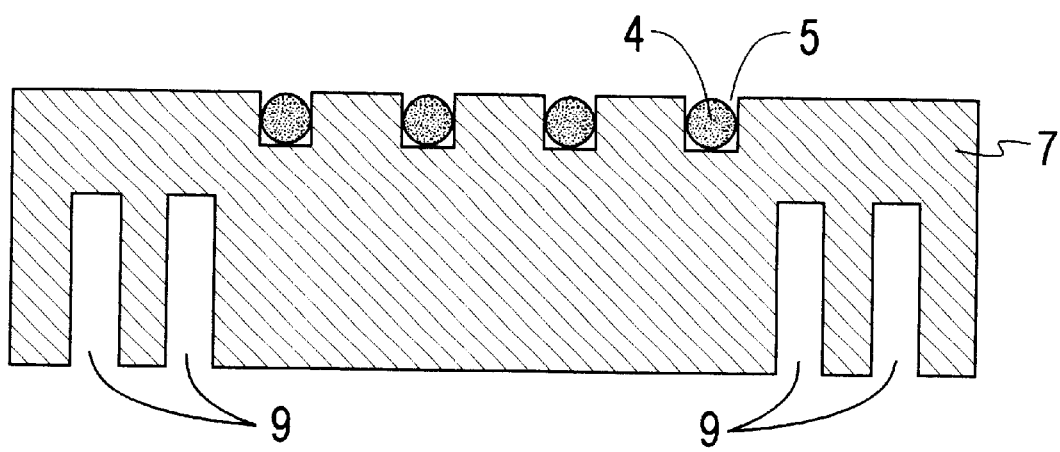
FIG. 4 shows a cross-section through a contact probe arrangement orthogonal to the guide plate, with contact probes in the guide grooves and with adjusting marks.

Many contacting device applications require precise adjustment of the contact probes to the corresponding contact pads of the device to be tested. For this purpose, adjusting marks 9 can be provided in the guide plate, as shown in FIG. 4. These adjusting marks are produced in well-defined positions relative to the guide grooves by means of photolithographic methods and precise etching techniques. As a result, they can be matched to the adjusting marks of the device to be tested by means of a simple transmitted-light optic.

Figure 5A:
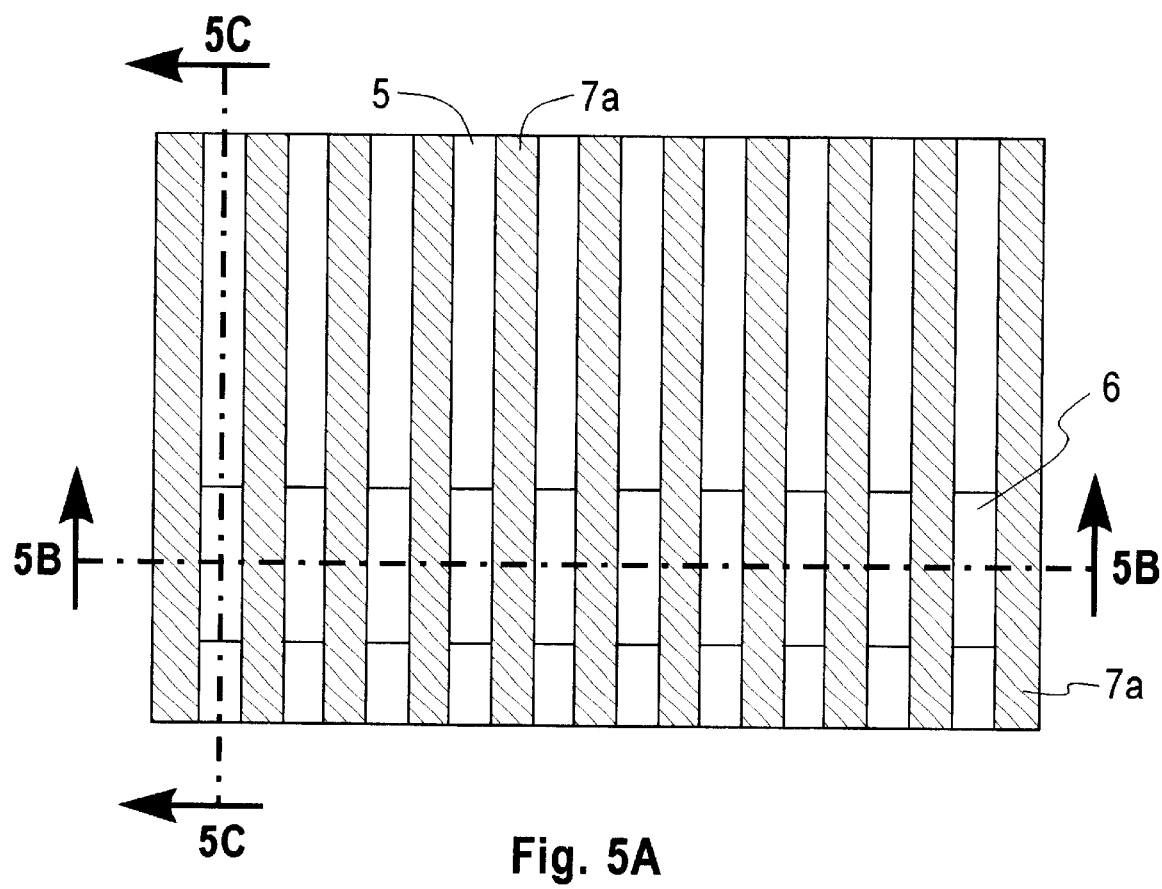
FIG. 5A shows a cross-section through the guide plate of a contact probe arrangement, in which the areas for lateral bending of the contact probes are alternatingly in a plane above the guide grooves and in a plane below them.

To achieve even more dense contact probe arrangements, in a further embodiment of the invention the areas 6a, 6b for lateral bending of the contact probes 4 are alternatingly in a plane above and in a plane below the plane of the guide grooves 5 for the contact probes. This embodiment is revealed in FIG. 5, showing a cross-section through a guide plate of a contact probe arrangement of the said design. FIG. 5A indicates three different planes or regions.

Figure 5B:
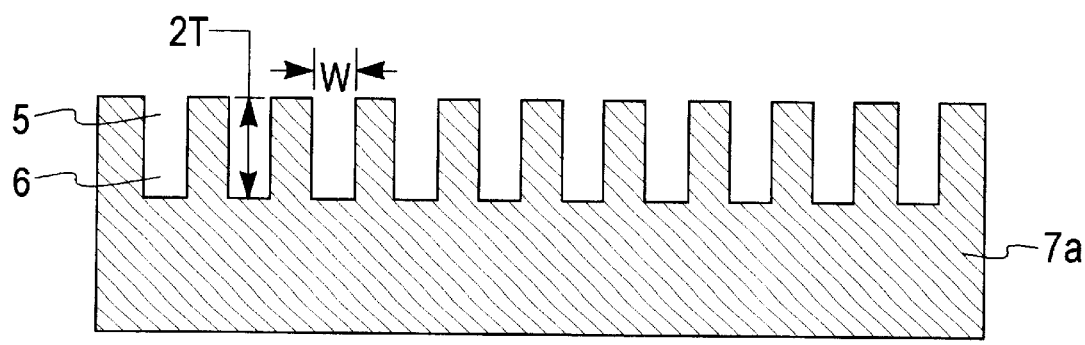
FIG. 5B shows a cross-section through the guide plate along the line 5B—5B in FIG. 5A.

The cross-section through the guide plate along the line 5B—5B in FIG. 5A shows, in FIG. 5B, the lowest plane, the plane or region of the areas for lateral bending, into which the contact probes can bend downwards as viewed from the plane of the guide grooves. The depth of the etched areas is 2 depth units, and is at least double the diameter of a contact probe. The middle plane or region corresponds to the plane of the guide grooves.

Figure 5C:
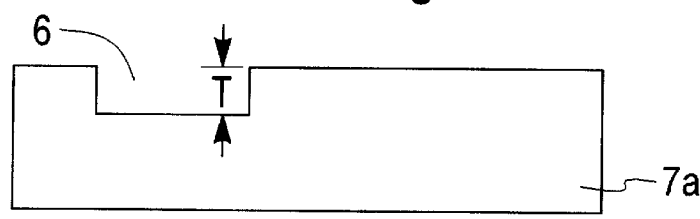
FIG. 5C shows a cross-section through the guide plate along the line 5C—5C in FIG. 5A.

FIG. 5C shows the cross-section through the guide plate along the line 5C—5C in FIG. 5A, and again the downward plane or region, as viewed from the guide grooves, of one group of areas for lateral bending.

The arrangement shown in FIGS. 5A to 5C requires a second guide plate as a protective plate, having the same structures as the first guide plate 7a. In this contact probe arrangement the plane or region with the guide grooves 5 and the plane below that plane are located in a first guide plate 7a and the plane or region above the plane with the guide grooves 5 is located in the protective plate in the form of a second guide plate 7b. The second guide plate 7b is offset to the first guide plate 7a by at least the length of an area 6a, 6b provided for lateral bending of the contact probes 4. The two guide plates 7a and 7b are joined together by adhesion or silicon-fusion bonding, as described in European Patent Application EP-A-0 626 720.

Figure 6A:
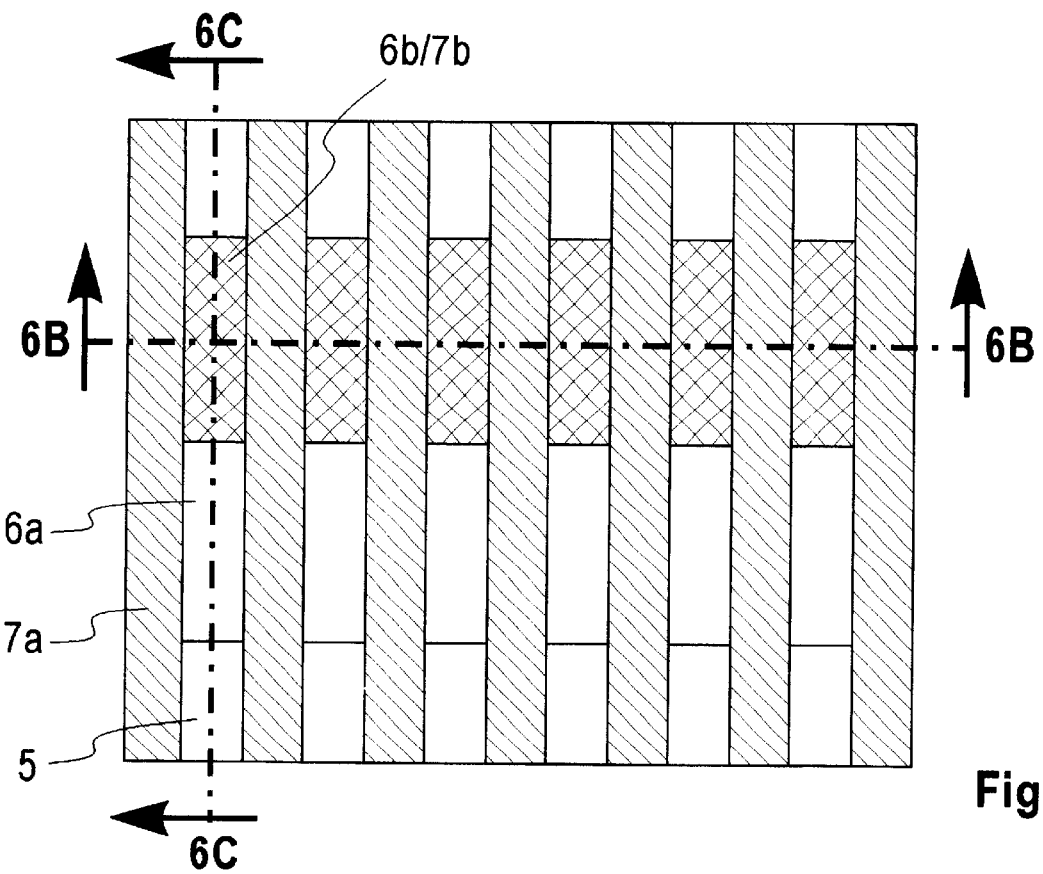
FIG. 6A shows a cross-section through the guide plate of a contact probe arrangement, in which the areas for lateral bending of the contact probes are alternatingly in a plane above the guide grooves and in a plane below them, and the protective plate is partially shown.

FIG. 6A likewise shows a cross-section through the guide plate of a contact probe arrangement, in which, as in FIG. 5A, the areas for lateral bending of the contact probes are alternatingly in a plane or region above the guide grooves and in a plane or region below them. In addition, the protective plate in the form of guide plate 7b is partially shown in FIG. 6A.

The areas 6a are etched downwards, as viewed from the plane of the guide grooves, into the guide plate 7a and the areas 6b are formed in the protective plate in the form of a second guide plate 7b.

Figure 6B:
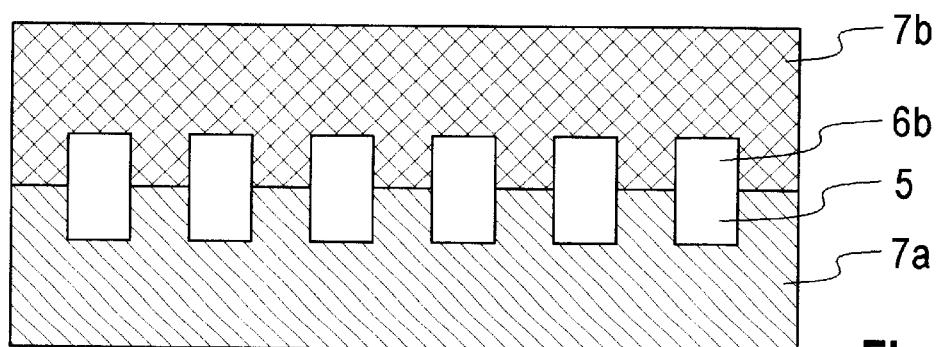
FIG. 6B shows a cross-section through the guide plate along the line 6B—6B in FIG. 6A.

The cross-section in FIG. 6B through the guide plate along the line 6B—6B in the area of the protective plate 7b in FIG. 6A shows the guide grooves 5 in the lower plate 7a and the areas 6b for lateral bending in the upper plate 7b, upwards as viewed from the plane of the guide grooves.

Figure 6C:
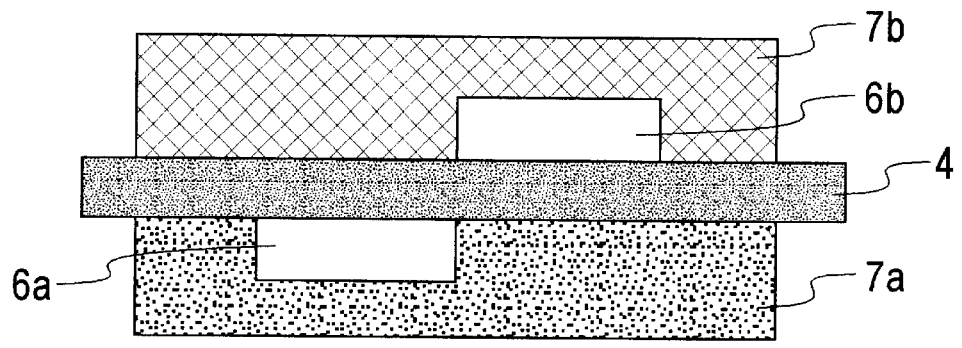
FIG. 6C shows a cross-section through the guide plate along the line 6C—6C in FIG. 6A.

The cross-section through the guide plate along the line 6C—6C in FIG. 6A shown in FIG. 6C illustrates how the areas 6a, 6b for lateral bending are arranged alternatingly upwards and downwards, as viewed from the plane of the guide grooves. FIG. 6C) also shows a contact probe in the guide groove.

Figure 7:
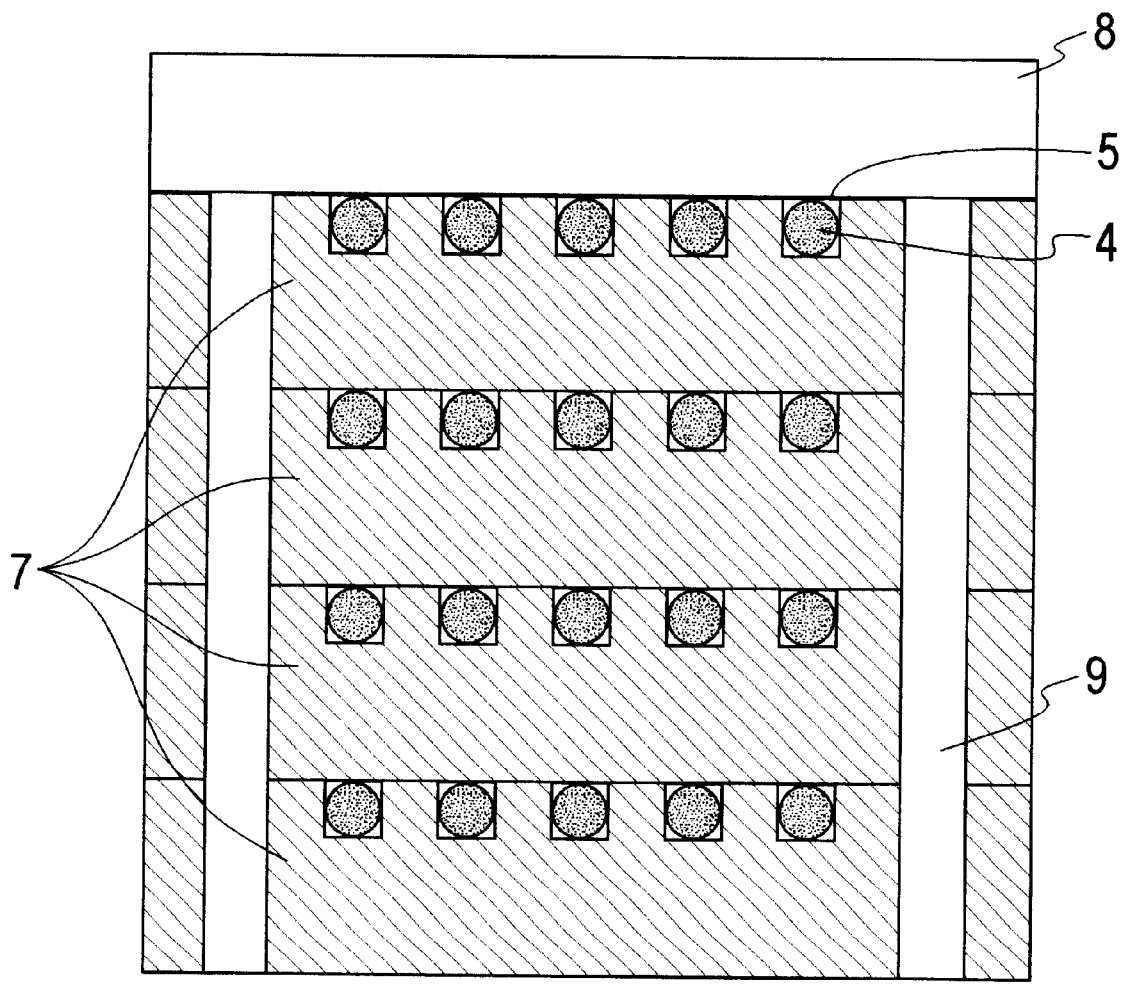
FIG. 7 shows a cross-section through a contact probe arrangement with several stacked guide plates, orthogonal to the surface of the guide plate, with contact probes in the guide grooves, and with adjusting marks adjusted to each other designed in the form of through-holes.

Flat, two-dimensional contact probe arrangements are possible with all embodiments of the invention described. To this end, several first and second guide plates 7a, 7b are stacked alternatingly on top of each other. For mutual adjustment of the guide plates, the adjusting marks 9 are designed as through-holes into which suitable guide pins can be inserted. A two-dimensional arrangement of this kind is shown in cross-section in FIG. 7, orthogonal to the surface of the guide plate, with contact probes in the guide grooves. The guide plates 7 are stacked on top of each other such that one of their surfaces has the structure of a first guide plate 7a and the other surface has the structure of a second guide plate 7b; the outward-pointing surfaces of both the bottom guide plate in the stack and of the protective plate 8 are not structured.

The stacked guide plates 7 are joined together by adhesion or silicon-fusion bonding and the protective plate 8 is joined to the last guide plate 7 in the stack by adhesion or anodic bonding.

As well as for the design of contact probe arrangements, the guide plates and guide plate stacks in accordance with the invention are also suitable as high-density ordering elements for other wires or transmission means, such as optical fibres.

While there has been described and illustrated a contact probe arrangement device containing guide grooves for a plurality of contact probes with areas for lateral bending of the plurality of probes in a guide plate and covered by a protective plate, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A contact probe arrangement for electrically connecting a test system to contact pads of a device to be tested comprising:
    a guide plate having a major surface,
    said guide plate having guide grooves formed in said major surface of said guide plate for a plurality of contact probes and areas adjacent said guide grooves for lateral bending of said plurality of contact probes parallel to said major surface of said guide plate,
    said areas run in a plane parallel to said major surface of said guide plate.

2. The contact probe arrangement in accordance with claim 1, wherein said areas for lateral bending of said plurality of contact probes are arranged along said guide grooves, alternating from side to side.

3. The contact probe arrangement in accordance with claim 1, wherein the depth T and the width W of said guide grooves and said areas for lateral bending of said plurality of contact probes correspond to at least the diameter of a contact probe.

4. The contact probe arrangement in accordance with claim 1, wherein said guide plate has first adjusting marks formed in a surface of said guide plate which can be matched to second adjusting marks of the device to be tested.

5. The contact probe arrangement in accordance with claim 4, wherein said guide grooves for said plurality of contact probes, said areas for lateral bending of said plurality of contact probes and said first adjusting marks are produced by etching.

6. The contact probe arrangement in accordance with claim 1, further including a plurality of guide plates covered by a protective plate, the material for said guide plates and the material for said protective plate having substantially the same coefficient of thermal expansion.

7. The contact probe arrangement in accordance with claim 6 wherein said material for said guide plates is silicon and the material for said protective plate is glass having substantially the same coefficient of thermal expansion as silicon.

8. The contact probe arrangement in accordance with claim 1, wherein said guide grooves for said plurality of contact probes and said areas for lateral bending of said plurality of contact probes are arranged laterally in the same plane.

9. A contact probe arrangement comprising:
    a guide plate,
    said guide plate having guide grooves formed in a surface of said guide plate for a plurality of contact probes and areas adjacent said guide grooves for lateral bending of said plurality of contact probes vertical to said surface of said guide plate,
    said areas for lateral bending of said plurality of contact probes are alternatingly in a first region above and in a second region below said guide grooves for said plurality of contact probes.

10. The contact probe arrangement in accordance with claim 9, wherein said guide grooves are in a plane and said first regions below said plane are located in a first guide plate and said second regions above said plane with said guide grooves are located in a protective plate in the form of a second guide plate, wherein said second guide plate is offset to said first guide plate by at least the length of said first regions, provided for lateral bending of said plurality of contact probes.

11. The contact probe arrangement in accordance with claim 10, further including several first and second guide plates stacked alternatingly on top of each other and mutually adjusted by means of guide pins located in the adjusting marks designed in the form of through-holes.

12. The contact probe arrangement in accordance with claim 11, wherein said guide plates are stacked such that one of their surfaces has the structure of a first guide plate and the other surface has the structure of a second guide plate, wherein the external surfaces of the bottom guide plate in the stack and of said protective plate are not structured.

13. The contact probe arrangement in accordance with claim 12, wherein said stacked guide plates are joined together by one of adhesion and silicon-fusion bonding, and said protective plate is joined to the last guide plate in said stack by one of adhesion and anodic bonding.

\* \* \* \* \*